US012328815B2

(12) United States Patent
Park

(10) Patent No.: US 12,328,815 B2
(45) Date of Patent: Jun. 10, 2025

(54) CIRCUIT BOARD AND DISPLAY DEVICE INCLUDING THE SAME

(71) Applicant: Samsung Display Co., Ltd., Yongin-Si (KR)

(72) Inventor: Youngjin Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 189 days.

(21) Appl. No.: 18/121,004

(22) Filed: Mar. 14, 2023

(65) Prior Publication Data

US 2023/0309223 A1    Sep. 28, 2023

(30) Foreign Application Priority Data

Mar. 22, 2022   (KR) .......................... 10-2022-0035467

(51) Int. Cl.
*H05K 1/11*    (2006.01)
(52) U.S. Cl.
CPC ..... *H05K 1/11* (2013.01); *H05K 2201/09381* (2013.01)
(58) Field of Classification Search
CPC ........ H05K 1/0287; H05K 1/11; H05K 1/111; H05K 2201/09463; H05K 2201/09681; H05K 2201/09663; H05K 2201/09745; H05K 2201/09381
See application file for complete search history.

(56) References Cited

U.S. PATENT DOCUMENTS

| 5,414,219 | A  | * | 5/1995 | Huetson | H05K 1/0293 228/180.1 |
| 5,426,266 | A  | * | 6/1995 | Brown | H01L 24/16 174/262 |
| 6,407,340 | B1 | * | 6/2002 | Wikstrom | H01L 23/367 257/E23.152 |
| 6,518,557 | B1 | * | 2/2003 | Izumi | H01L 27/14676 257/676 |
| 2007/0103182 | A1 | * | 5/2007 | Nawata | H05K 1/0293 174/255 |
| 2009/0185096 | A1 |   | 7/2009 | Park | |
| 2019/0204638 | A1 | * | 7/2019 | Park | G02F 1/1333 |

FOREIGN PATENT DOCUMENTS

KR    10-2007-0075713 A    7/2007
KR         10-0790575 B1    1/2008
KR    10-2009-0079687 A    7/2009

* cited by examiner

*Primary Examiner* — Roshn K Varghese
(74) *Attorney, Agent, or Firm* — Innovation Counsel LLP

(57) ABSTRACT

A circuit board includes a first pad, a second pad, and a soldering element. The first pad comprises a first body and a first mesh structure directly connected to the first body. The second pad comprises a second body and a second mesh structure. The second mesh structure is directly connected to the second body, is spaced from the first mesh structure in a direction, and is disposed between the first mesh structure and the second body in the first direction. The soldering element is disposed on the first pad and the second pad, is partially disposed between the first mesh structure and the second mesh structure, and electrically connects the first pad to the second pad.

20 Claims, 10 Drawing Sheets

CIRCUIT BOARD AND DISPLAY DEVICE INCLUDING THE SAME

CROSS-REFERENCE TO RELATED APPLICATION

This application claims priority under 35 USC § 119 to Korean Patent Application No. 10-2022-0035467, filed on Mar. 22, 2022, in the Korean Intellectual Property Office (KIPO), the content of which is herein incorporated by reference in its entirety.

BACKGROUND

1. Field

The technical field is related to a circuit board and a display device including the circuit board.

2. Description of the Related Art

A display device may display images in response to input signals. Modern display devices include liquid crystal display devices and organic light emitting display devices.

A display device may include a display panel and a circuit board connected to the display panel. Wires, pads, and/or electronic devices for providing driving signals to the display panel may be disposed on the circuit board.

SUMMARY

Embodiment may be related to a circuit board with low manufacturing cost and satisfactory workability.

Embodiment may be related to a display device including the circuit board.

A circuit board may include a first pad including a first body portion and a first mesh portion having a mesh form and disposed adjacent to the first body portion in a first direction, a second pad spaced from the first pad in the first direction, and including a second mesh portion facing the first mesh portion and having a mesh form and a second body portion disposed adjacent to the second mesh portion in the first direction, and a soldering element disposed on the first pad and the second pad, filling a space between the first pad and the second pad, and electrically connecting the first pad and the second pad to each other.

A shape of the first mesh portion and a shape of the second mesh portion may be symmetrical to each other.

In an embodiment, each of the first mesh portion and the second mesh portion may include first diagonal portions extending in a first diagonal direction crossing the first direction, second diagonal portions extending in a second diagonal direction crossing the first direction and the first diagonal direction, and junction portions where the first diagonal portions and the second diagonal portions intersect.

The junction portions of the first mesh portion may include first junction portions located at an edge of the first mesh portion in the first direction, the junction portions of the second mesh portion may include second junction portions located at an edge of the second mesh portion in a direction opposite to the first direction, and the first intersection portions and the second intersection portions may face each other.

The soldering element may include a first portion overlapping the first pad, a second portion overlapping the second pad, and a third portion filling the space between the first pad and the second pad, and connecting the first intersection portions and the second intersection portions.

The first portion may be integrally disposed on the first body portion and the first mesh portion, and the second portion may be integrally disposed on the second body portion and the second mesh portion.

At least a portion of the third portion of the soldering element may be removed along a second direction perpendicular to the first direction.

A portion of the first portion of the soldering element overlapping the first mesh portion may be removed along a second direction perpendicular to a second direction perpendicular to the first direction.

A portion of the second portion of the soldering element overlapping the second mesh portion may be removed along a second direction perpendicular to the first direction.

The first body portion of the first pad may be connected to the first wire, and the second body portion of the second pad may be connected to the second wire.

A display device may include a display panel including a display area where pixels is disposed on and a non-display area disposed around the display area, and a circuit board attached to the non-display area of the display panel. The circuit board may include a first pad including a first body portion and a first mesh portion having a mesh form and disposed adjacent to the first body portion in a first direction, a second pad spaced from the first pad in the first direction, and including a second mesh portion facing the first mesh portion and having a mesh form and a second body portion disposed adjacent to the second mesh portion in the first direction, and a soldering element disposed on the first pad and the second pad, filling a space between the first pad and the second pad, and electrically connecting the first pad and the second pad to each other.

A shape of the first mesh portion and a shape of the second mesh portion may be symmetrical to each other.

In an embodiment, each of the first mesh portion and the second mesh portion may include first diagonal portions extending in a first diagonal direction crossing the first direction, second diagonal portions extending in a second diagonal direction crossing the first direction and the first diagonal direction, and junction portions where the first diagonal portions and the second diagonal portions intersect.

The junction portions of the first mesh portion may include first junction portions located at an edge of the first mesh portion in the first direction, the junction portions of the second mesh portion may include second junction portions located at an edge of the second mesh portion in a direction opposite to the first direction, and the first intersection portions and the second intersection portions may face each other.

The soldering element may include a first portion overlapping the first pad, a second portion overlapping the second pad, and a third portion filling the space between the first pad and the second pad, and connecting the first intersection portions and the second intersection portions.

The first portion may be integrally disposed on the first body portion and the first mesh portion, and the second portion may be integrally disposed on the second body portion and the second mesh portion.

At least a portion of the third portion of the soldering element may be removed along a second direction perpendicular to the first direction.

A portion of the first portion of the soldering element overlapping the first mesh portion may be removed along a second direction perpendicular to a second direction perpendicular to the first direction.

A portion of the second portion of the soldering element overlapping the second mesh portion may be removed along a second direction perpendicular to the first direction.

The first body portion of the first pad may be connected to the first wire, and the second body portion of the second pad may be connected to the second wire.

An embodiment may be related to a circuit board. The circuit board may include a first pad, a second pad, and a soldering element. The first pad may include a first body and a first mesh structure directly connected to the first body. The second pad may include a second body and a second mesh structure. The second mesh structure may be directly connected to the second body, may be spaced from the first mesh structure in a direction, and may be disposed between the first mesh structure and the second body in the first direction. The soldering element may be disposed on the first pad and the second pad, may be partially disposed between the first mesh structure and the second mesh structure, and may electrically connect the first pad to the second pad.

The first mesh structure may be a mirror image of the second mesh structure in a plan view of the circuit board.

A second direction may be perpendicular to the first direction. The first mesh structure may include the following parts: first conductive lines each extending in a third direction oblique relative to the first direction; second conductive lines each extending in a fourth direction oblique relative to the first direction and different from the third direction; and first junctions where the first conductive lines and the second conductive lines meet. The second mesh structure may include the following parts: third conductive lines each extending oblique relative to the first direction; fourth conductive lines each extending oblique relative to the first direction and not parallel to the third conductive lines; and second junctions where the third conductive lines and the fourth conductive lines meet.

The first junctions may include first edge junctions located at an edge of the first pad. The second junctions may include second edge junctions located at an edge of the second pad. The first edge junctions face the second edge junctions and/or respectively correspond to the second edge junctions.

The soldering element may include the following portions: a first portion overlapping the first pad; a second portion overlapping the second pad; and a third portion disposed between the first portion and the second portion and directly contacting the first edge junctions and the second edge junctions.

The first portion may be disposed on both the first body and the first mesh structure. The second portion may be disposed on both the second body and the second mesh structure.

The third portion of the soldering element may include an opening that extends in the second direction.

The first portion of the soldering element may include an opening that extends in the second direction.

The second portion of the soldering element may include an opening that extends in the second direction.

The circuit board may include the following elements: a first wire electrically connected through the first body to the first mesh structure; and a second wire electrically connected through the second body to the mesh structure.

An embodiment may be related to a display device. The display device may include a display panel and a circuit board. The display panel may include a display area and a non-display area. The display area may include pixels. The non-display area may abut the display area. The circuit board may be attached to the non-display area and may include one or more of the features described above.

According to embodiments, a pad unit of a circuit board may include a first pad and a second pad spaced from each other and electrically connected to each other by a soldering element. Accordingly, no or minimum low/zero-resistance elements may be required for the circuit board. Advantageously, the manufacturing cost of the circuit board may be satisfactorily low.

In addition, portions of the first pad and the second pad facing each other may have a mesh structure. Accordingly, it is possible to prevent or reduce cold soldering defects of the pad unit. The soldering of the first pad and the second pad may be easily performed. If necessary (e.g., for the evaluation of the circuit board), the soldering element may be easily cut to efficiently and effectively insulate the first pad from the second pad. Advantageously, the workability of the circuit board may be satisfactory.

DETAILED DESCRIPTION OF EMBODIMENTS

Figure 1:
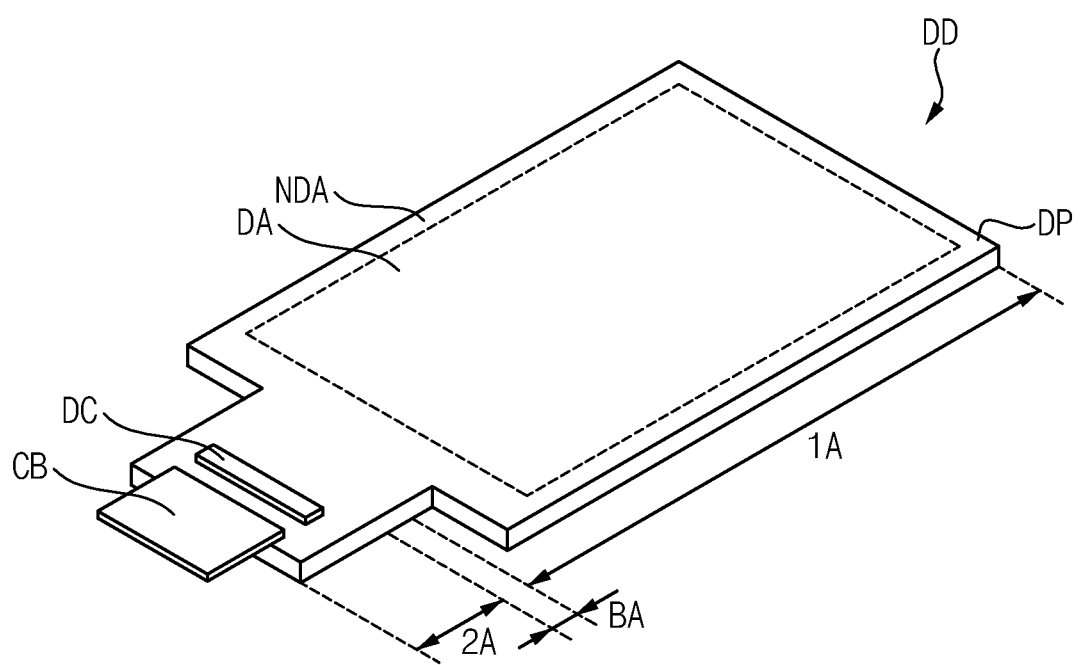
FIG. 1 is a perspective view illustrating a display device according to an embodiment.

Examples of embodiments are described with reference to the accompanying drawings. The same reference numerals may be used for the same components or similar components in the drawings.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The term "on" may mean "directly on" or "indirectly on." The term "connect" may mean "directly connect" or "indirectly connect." The term "connect" may mean "mechanically connect" and/or "electrically connect." The term "insulate" may mean "electrically insulate" or "electrically isolate." The term "conductive" may mean "electrically conductive." The term "drive" may mean "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "form" may mean "structure." The term "portion" may mean "member." The expression that a first element overlaps with a second element in a plan view may mean that the first element overlaps the second element in direction perpendicular to a substrate.

FIG. 1 is a perspective view illustrating a display device DD according to an embodiment.

Referring to FIG. 1, a display device DD may include a display panel DP, a driving circuit chip DC, and a circuit board CB.

The display panel DP may include a display area DA and a non-display area NDA. A displaying part including pixels for generating an image may be disposed in the display area DA. The pixels may be arranged in a matrix form in the display area. Light emitted from the pixels may be combined to display the image. Each of the pixels may include at least one transistor and at least one light emitting element.

The non-display area NDA may be disposed around the display area DA. The non-display area NDA may surround the display area DA in a plan view of the display device DD.

The display panel DP may include a first area 1A, a second area 2A, and a bending area BA. The second area 2A may be separated from the first area 1A in a first direction. The bending area BA may be disposed between the first area 1A and the second area 2A. The bending area BA of the display panel DP may be bent based on a bending axis extending in a second direction perpendicular to the first direction. When the bending area BA of the display panel DP is bent, the second area 2A may be disposed under or behind the first area 1A.

The first area 1A may include the display area and a first portion of the non-display area NDA. The bending area BA may include a second portion of the non-display area NDA. The second area 2A may include a third portion of the non-display area NDA.

Each of the bending area BA and the second area 2A may be narrower than the first area 1A in the second direction. The width of the bending area BA in the second direction may be substantially same as the width of the second area 2A in the second direction.

The first area 1A, the bending area BA, and the width of the second area 2A may be substantially equally wide in the second direction. When not bent, the display panel DP may have a rectangular shape in a plan view of the display panel DP.

The driving circuit chip DC may be disposed on the second area 2A of the display panel DP. The driving circuit chip DP may be disposed on the third portion of the non-display area NDA of the display panel DP. The driving circuit chip DC may be integrated directly on the display panel DP through a COP (chip on plastic) method.

The driving circuit chip CB may be a rigid printed circuit board or a flexible printed circuit board.

The driving circuit chip DC and the circuit board CB may provide driving signals to the display panel DP. The driving signals may include a driving voltage, a gate signal, a data signal, etc. for driving the display panel DP.

The circuit board CB may include a base substrate, and may include wires, pads, and/or electronic elements for providing the driving signals to the display panel DP.

Figure 2:
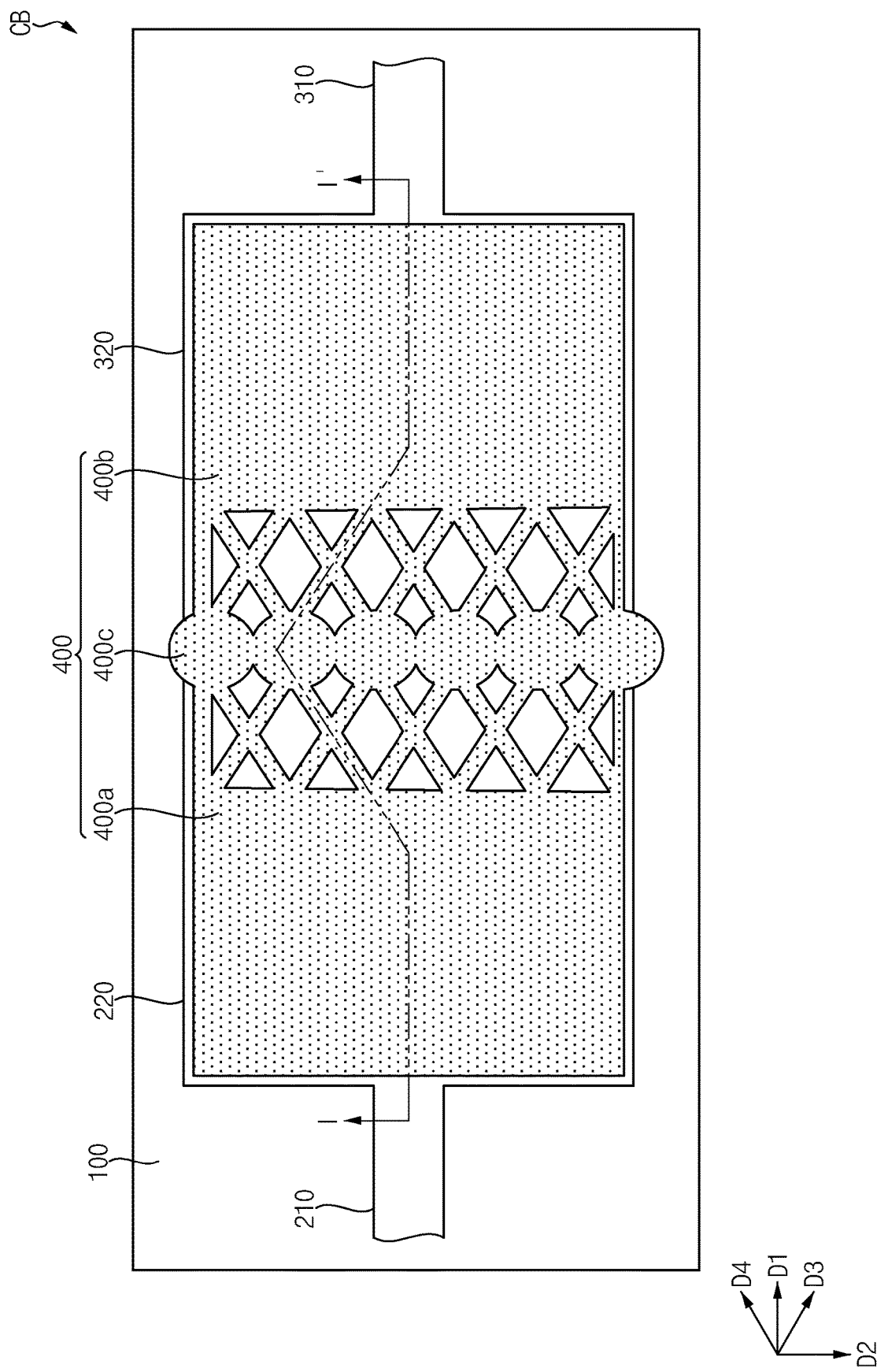
FIG. 2 is a plan view illustrating a portion of a circuit board included in the display device of FIG. 1 according to an embodiment.
Figure 3:
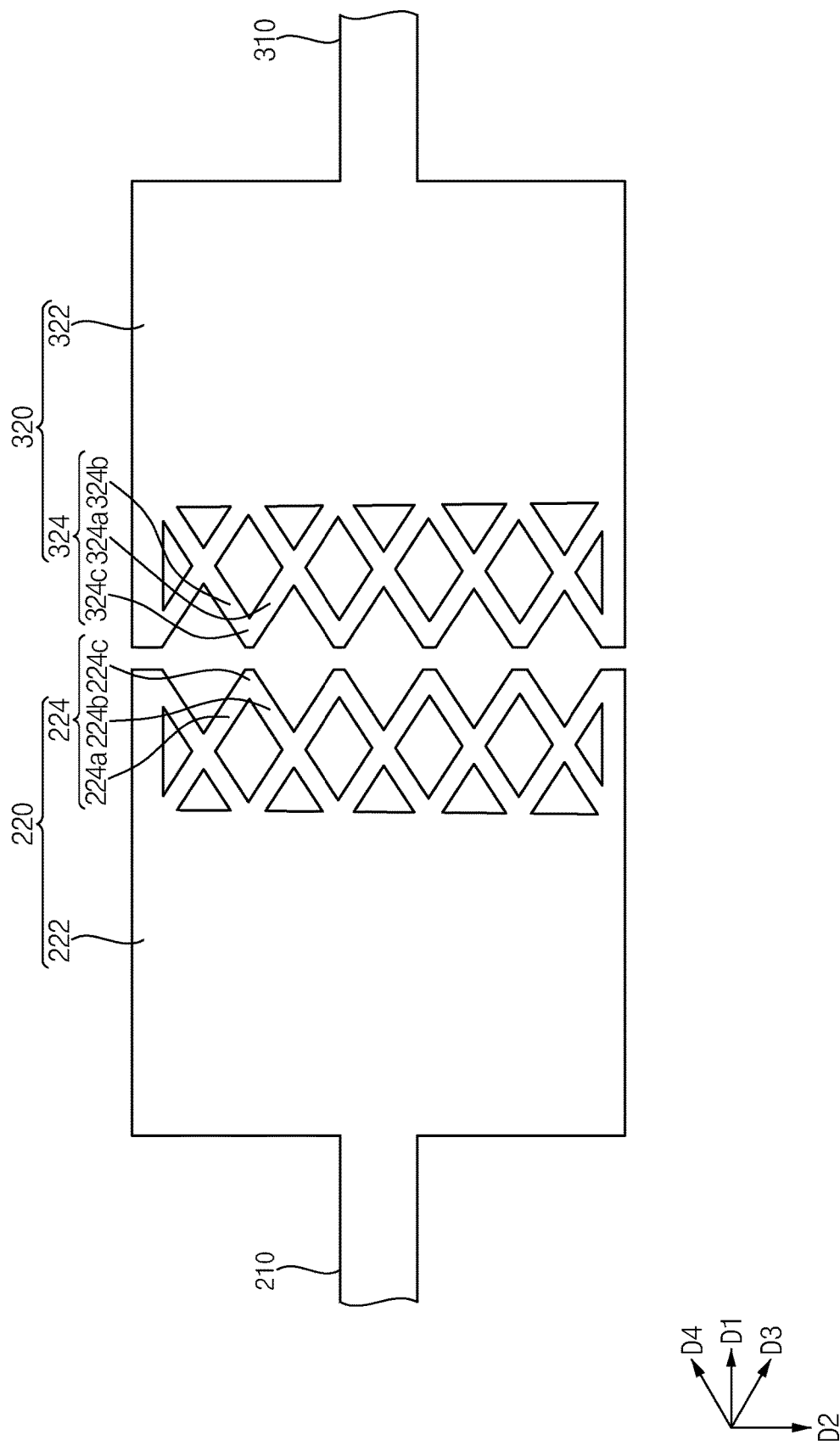
FIG. 3 is a plan view illustrating a first pad and a second pad included in the circuit board of FIG. 2 according to an embodiment.
Figure 4:
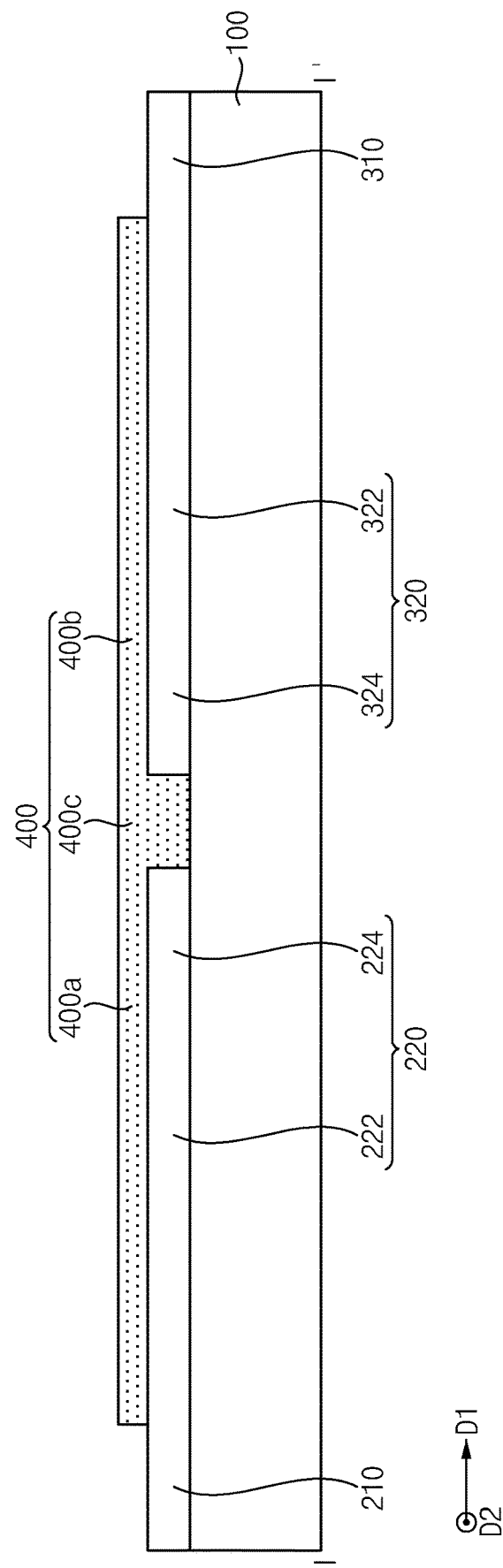
FIG. 4 is a cross-sectional view taken along a line I-I' of FIG. 2 according to an embodiment.

FIG. 2 is a plan view illustrating a portion of a circuit board CB included in the display device DD of FIG. 1 according to an embodiment. FIG. 3 is a plan view illustrating a first pad and a second pad included in the circuit board of FIG. 2 according to an embodiment. FIG. 4 is a cross-sectional view taken along a line I-I' of FIG. 2 according to an embodiment.

Referring to FIG. 2, FIG. 3, and FIG. 4, the circuit board CB may include a base substrate 100, and a pad unit disposed on the base substrate 100. The pad unit may include a first pad 220, a second pad 320, and a soldering element 400.

As shown in FIG. 3, the second pad 320 may be spaced from the first pad 220 in a first direction D1. Each of the first pad 220, the second pad 320, and the soldering element 400 may include a conductive material. The soldering element 400 may electrically connect the first pad 220 to the second pad 320.

The first pad 220 may include a first body portion 222 and a first mesh portion 224. The first body portion 222 and the first mesh portion 224 may be integrally formed. The first body portion 222 and the first mesh portion 224 may be directly, electrically, and mechanically connected to each other. The first pad 320 may be an end portion of a first wire 210 or may be directly connected to an end of a first wire 210.

The first mesh portion 224 may be disposed adjacent to the first body portion 222 in a first direction D1. The first mesh portion 224 may have a mesh form.

The first mesh portion 224 may include first diagonal portions 224a (or first conductive lines 224a), second diagonal portions 224b (or second conductive lines 224b), and junction portions 224c (or first junctions 224c).

Each of the first diagonal portions 224a may extend in a third direction D3 oblique relative to the first direction D1. The first diagonal portions 224a may be spaced from each other at a predetermined interval in a second direction D2 perpendicular to the first direction D1. The third direction D3 may be defined as a first oblique/diagonal direction. A width of the each of the first diagonal portions 224a and an interval between adjacent first diagonal portions 224a may be set in various ways.

Each of the second diagonal portions 224b may extend in a fourth direction D4 oblique relative to the first direction D1 and different from the third direction D3. The second diagonal portions 224b may be spaced from each other at a predetermined interval in the second direction D2. The fourth direction D4 may be defined as a second oblique/diagonal direction. A width of the each of the second diagonal portions 224b and an interval between adjacent second diagonal portions 224b may be set in various ways.

An angle between the first direction D1 and the third direction D3 and an angle between the first direction D1 and the fourth direction D4 may be set in various ways. That is, an angle between a first diagonal portion 224a and a second diagonal portion 224b may be set in various ways.

The third direction D3 may be symmetrical to (i.e., a mirror image of) the fourth direction D4 with reference to the first direction D1. The angle between the first direction D1 and the third direction D3 may be substantially equal to the angle between the first direction D1 and the fourth direction D4.

The junction portions 224c may be where the first diagonal portions 224a and the second diagonal portions 224b meet. Some first junction portions 224c may be positioned at edges of the first mesh portion 224 in the first direction D1. The edges of the first mesh portion 224 in the first direction D1 may include first junction portions 224c spaced from each other at a predetermined interval in the second direction D2.

The second pad 320 may be spaced from the first pad 220 in the first direction D1. The second pad 320 may include a second body portion 322 and a second mesh portion 324. The second body portion 322 and the second mesh portion 324 may be integrally formed. The second body portion 322 and the second mesh portion 324 may be directly, electrically, and mechanically connected to each other.

The second body portion 322 may be connected to a second wire 310. The second body portion 322 and the second wire 310 may be integrally formed. The second wire 310 and the second pad 320 may be directly, electrically, and physically connected to each other. The second pad 320 may be an end portion of the second wire 310 or may be directly connected to an end of the second wire 310.

The second mesh portion 324 may be spaced from the first mesh portion 224 in the first direction D1. The second mesh portion 324 may face the first mesh portion 224. The second mesh portion 324 may have a mesh form. The second body portion 322 may be adjacent to the second mesh portion 324 in the first direction D1.

The second mesh portion 324 may include first diagonal portions 324a (or third conductive lines 324a), second diagonal portions 324b (or fourth conductive lines 324b), and junction portions 324c (or second junctions 324c).

Each of the first diagonal portions 324a may be extend in the third direction D3. The first diagonal portions 324a may be spaced from each other at a predetermined interval in the second direction D2. A width of each of the first diagonal portions 324a and an interval between adjacent first diagonal portions 324a may be set in various ways.

Each of the second diagonal portions 324b may extend in the fourth direction D4. The second diagonal portions 324b may be spaced from each other at a predetermined interval in the second direction D2. A width of each of the second diagonal portions 324b and an interval between adjacent second diagonal portions 324b may be set in various ways. An angle between a first diagonal portion 324a and a second diagonal portion 324b may be set in various ways.

The junction portions 324c may be where the first diagonal portions 324a and the second diagonal portions 324b meet. Some second junction portions 324c may be positioned at edges of the first mesh portion 324. The edges of the first mesh portion 324 may include first junction portions 324c spaced from each other at a predetermined interval in the second direction D2.

In a plan view of the circuit board CB, the first mesh portion 224 and the second mesh portion 324 may be mirror images to each other with reference to a straight geometric line extending in the second direction D2 between the first mesh portion 224 and the second mesh portion 324. The first junction portions 224c may correspond to the second junction portions 324c one-to-one.

The soldering element 400 may be disposed on the first pad 220 and the second pad 320 and may fill a space between the first pad 220 and the second pad 320. Accordingly, the soldering element 400 may electrically connect the first pad 220 and the second pad 320 to each other. The soldering element 400 may be a set of solder.

The soldering element 400 may include a first portion 400a, a second portion 400b, and a third portion 400c. The first portion 400a, the second portion 400b, and the third portion 400c may be integrally formed. Each of the first portion 400a and the second portion 400b may be directly, electrically, and mechanically connected to the third portion 400c.

The first portion 400a may overlap the first pad 220. The first portion 400a may be disposed on the first body portion 222 and the first mesh portion 224. The first portion 400a may have structures corresponding to structures of the first body portion 222 and the first mesh portion 224.

The second portion 400b may overlap the second pad 320. The second portion 400b may be disposed on the second body portion 322 and the second mesh portion 324. The second portion 400b may have structures corresponding to structures of the second body portion 322 and the second mesh portion 324.

The third portion 400c may fill the space between the first pad 220 and the second pad 320. The third portion 400c may fill the space or spaces between the first mesh portion 224 and the second mesh portion 324.

The third portion 400c may electrically connect the junction portions 224c and the second junction portions 324c facing each other.

The pad unit (including the first pad 220, the second pad 320, and the soldering element 400) may be implemented for various purposes, such as evaluation of the circuit board CB, stabilizing power, and setting options. For the above purpose, pads spaced from each other may be connected with one or more low/zero-resistance elements. Nevertheless, the low/zero-resistance element(s) may incur high manufacturing cost. When the pads need to be insulated (e. g., electrically opened), the process of removing the low/zero-resistance element(s) may cause damage to wires, electronic elements, etc. in the circuit board.

According to embodiments, the pad unit may include the first pad 220 and the second pad 320 spaced from each other and electrically connected to each other by the soldering element 400. Accordingly, no or minimum low/zero-resistance elements may be required for the circuit board CB. Advantageously, the manufacturing cost of the circuit board CB may be satisfactorily low.

In addition, portions of the first pad 220 and the second pad 320 facing each other may have mesh structures. Accordingly, it is possible to prevent or reduce cold soldering defects of the pad unit. The soldering of the first pad 220 and the second pad 320 may be easily performed. If necessary (e.g., for the evaluation of the circuit board CB), the soldering element 400 may be easily cut to efficiently and effectively insulate the first pad 220 from the second pad 320. Advantageously, the workability of the circuit board CB may be satisfactory.

FIG. 5, FIG. 6, FIG. 7, and FIG. 8 are plan views illustrating structures formed in at least one method of insulating the first pad 220 and the second pad 320 included in the circuit board CB of FIG. 2 from each other according to at least one embodiment. FIG. 9 is a cross-sectional view taken along a line II-II' of FIG. 7 according to an embodiment.

With reference to FIG. 5, FIG. 6, FIG. 7, FIG. 8, and FIG. 9, if necessary (e.g., for evaluation of the circuit board CB), the first pad 220 may be insulated from the second pad 320 by cutting and/or partially removing the soldering element 400.

Figure 5:
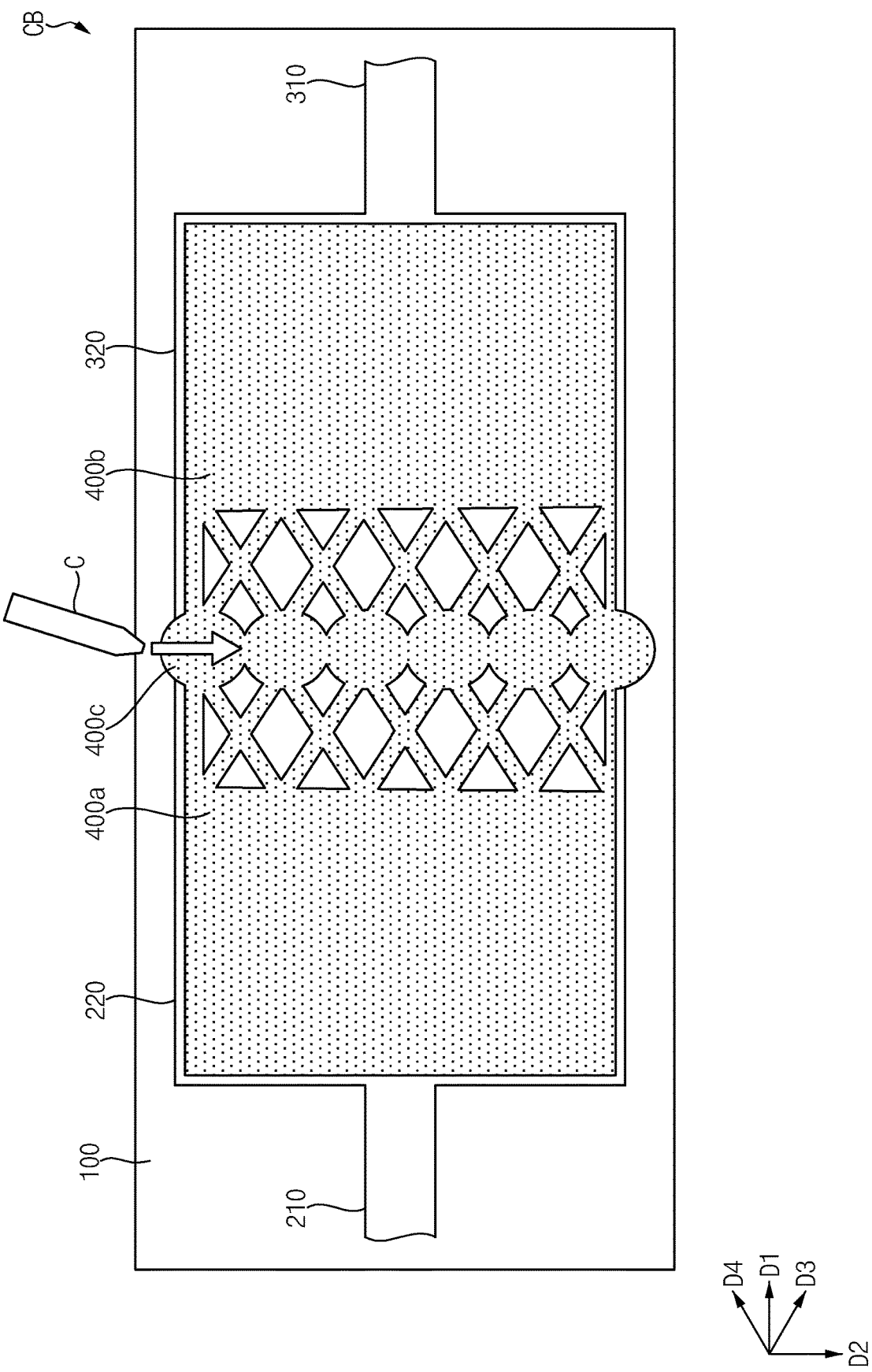
FIG. 5, FIG. 6, FIG. 7, and FIG. 8 are plan views illustrating structures formed in at least one method of insulating the first pad and the second pad included in the circuit board of FIG. 2 from each other according to at least one embodiment.

Referring to FIG. 5, a portion of the soldering element 400 may be removed using a cutter C, such as iron cutting machine or a safety knife.

Figure 6:
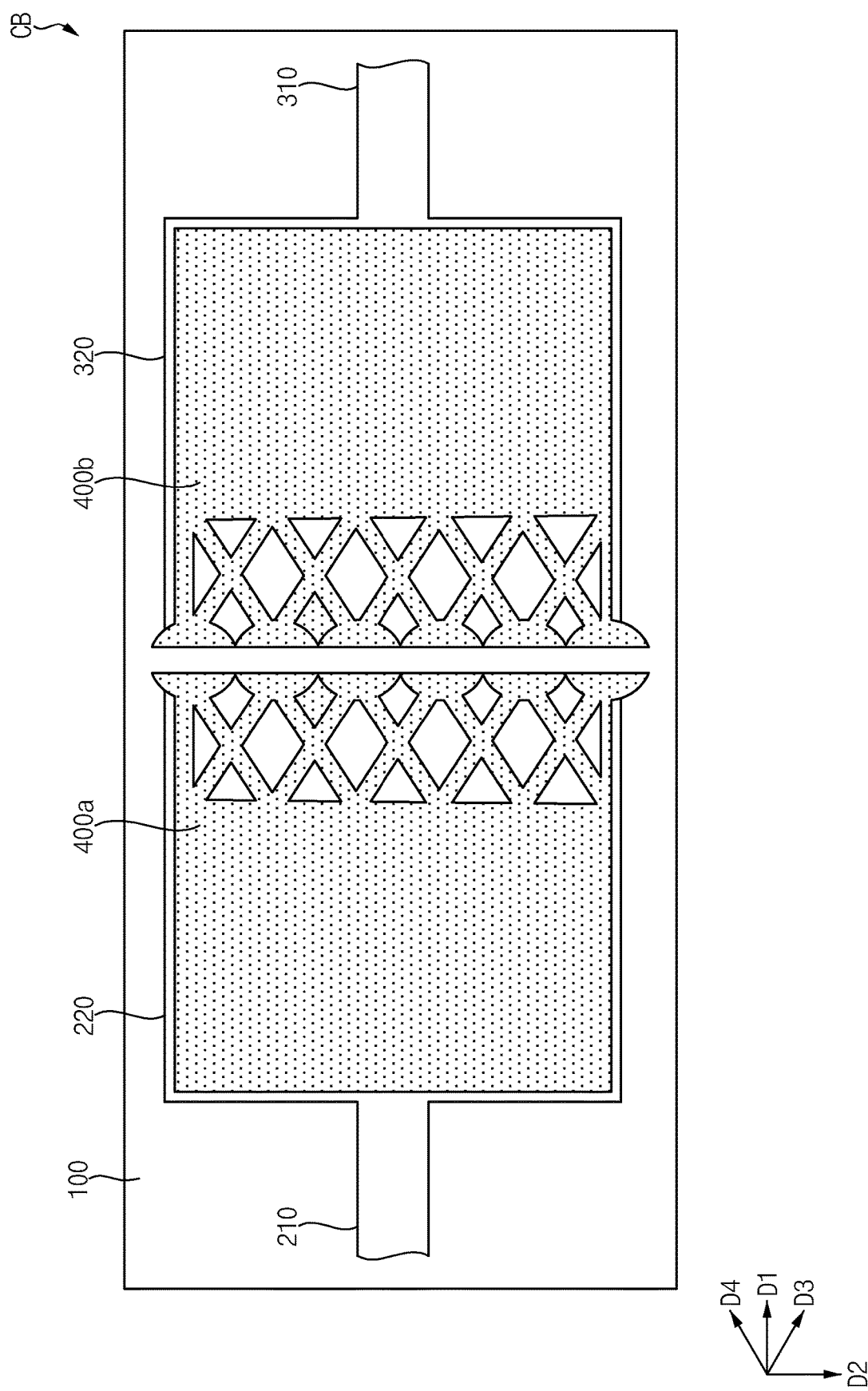

Referring to FIG. 5 and FIG. 6, a portion of the third portion 400c filling the space between the first pad 220 and the second pad 320 may be removed using the cutter C along the second direction D2. Accordingly, the soldering element 400 may be separated into a portion overlapping the first pad 220 and a portion overlapping the second pad 320. Accordingly, the first pad 220 may be insulated from the second pad 320. Due to the mesh structures of the first mesh portion 224 and the second mesh portion 324, the third portion 400c positioned between the first mesh portion 224 and the second mesh portion 324 may be easily identified and may be easily cut.

After the evaluation of the circuit board CB, the first pad 220 and the second pad 320 may remain insulated from each other.

After the evaluation of the circuit board CB, the first pad 220 and the second pad 320 may be electrically connected to each other again by solder the opening of the third portion 400c of the soldering element 400.

Figure 7:
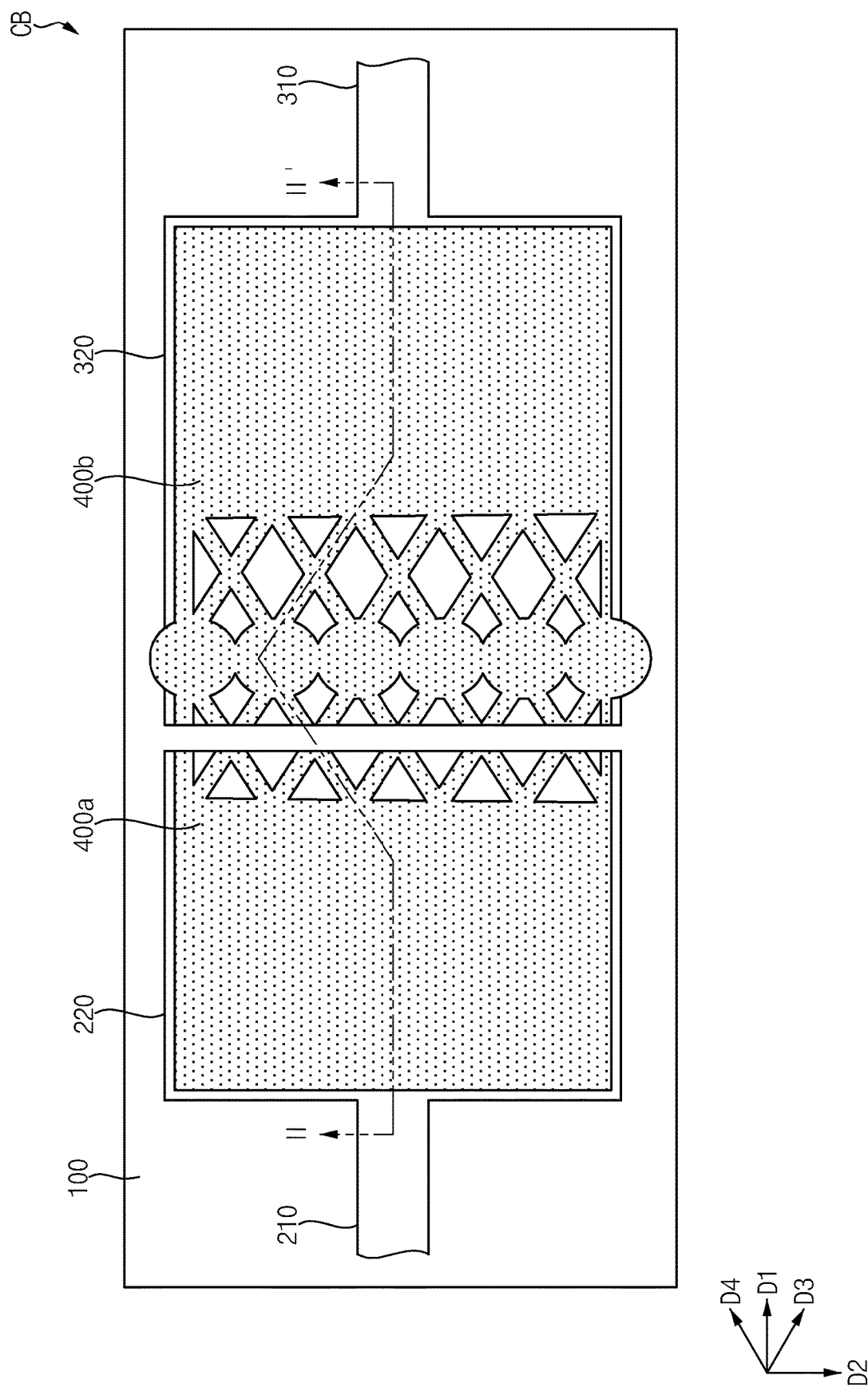

Referring to FIG. 7 and FIG. 9, a portion of the first mesh portion 224 of the first pad 220 and a portion of the first portion 400a of the soldering element 400 overlapping the portion of the first mesh portion 224 may be removed using the cutter C along the second direction D2. The first pad 220 and the soldering element 400 may be simultaneously cut by the cutter C.

Figure 8:
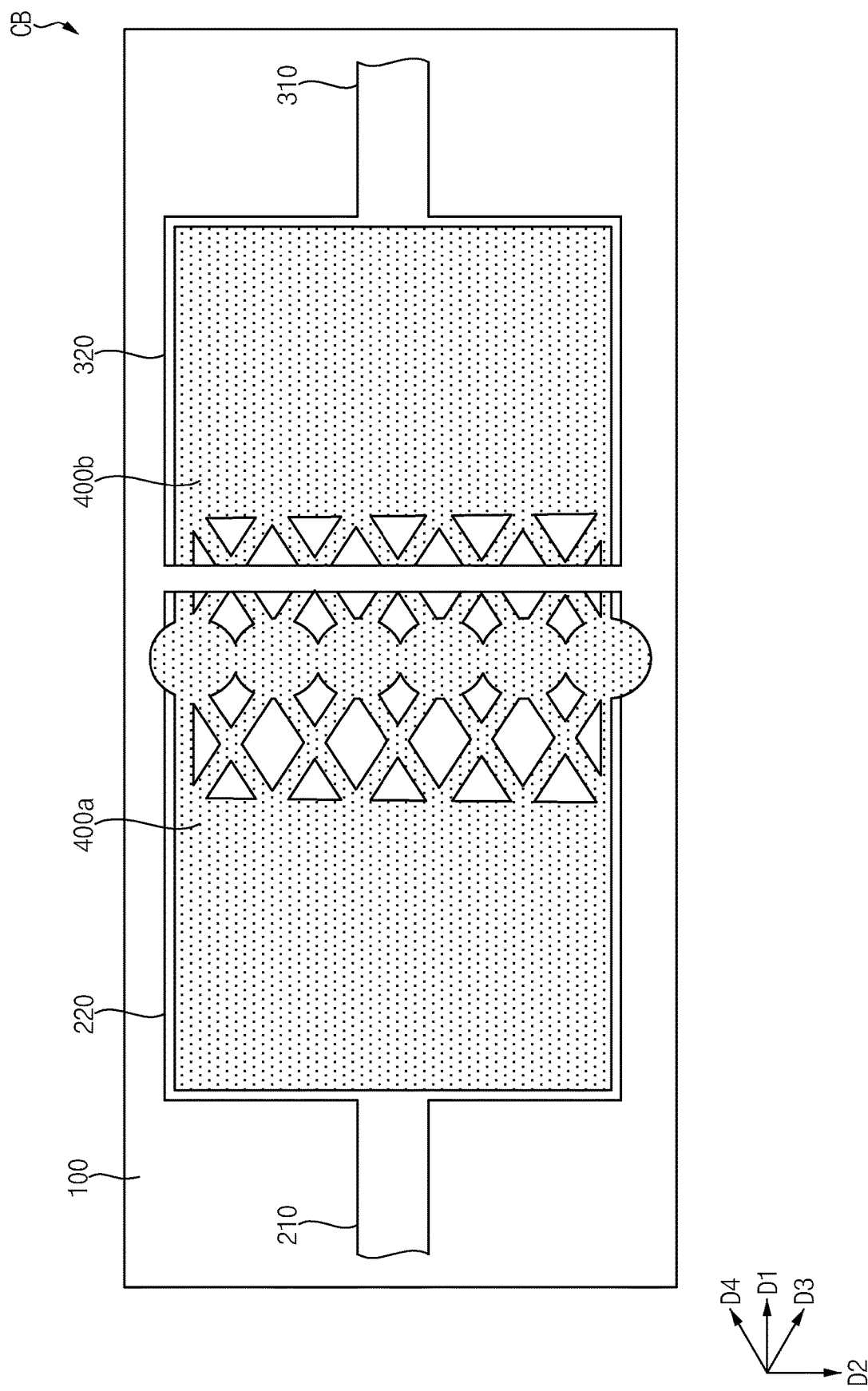
Figure 9:
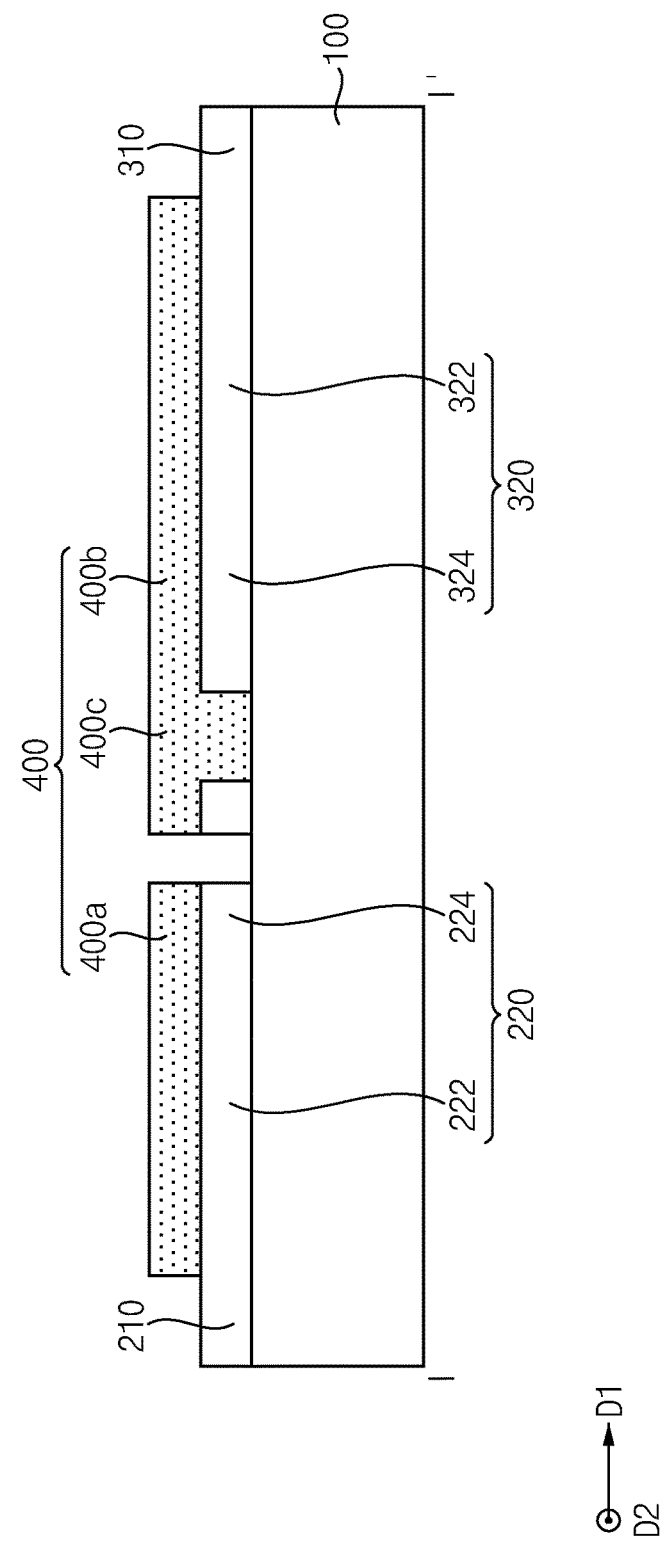
FIG. 9 is a cross-sectional view taken along a line II-II' of FIG. 7 according to an embodiment.

Referring to FIG. 8, a portion of the second mesh portion 324 of the second pad 320 and a portion of the second portion 400b of the soldering element 400 overlapping the portion of the second mesh portion 324 may be removed using the cutter C along the second direction D2. The second pad 320 and the soldering element 400 may be simultaneously cut by the cutter C.

According to embodiments, the pad unit may include the first pad 220 and the second pad 320 spaced from each other and electrically connected to each other by the soldering element 400. Accordingly, no or minimum low/zero-resistance elements may be required for the circuit board CB. Advantageously, the manufacturing cost of the circuit board CB may be satisfactorily low.

In addition, portions of the first pad 220 and the second pad 320 facing each other may have mesh structures. Accordingly, it is possible to prevent or reduce cold soldering defects of the pad unit. The soldering of the first pad 220 and the second pad 320 may be easily performed. If necessary (e.g., for the evaluation of the circuit board CB), the soldering element 400 may be easily cut to efficiently and effectively insulate the first pad 220 from the second pad 320. Advantageously, the workability of the circuit board CB may be satisfactory.

Figure 10:
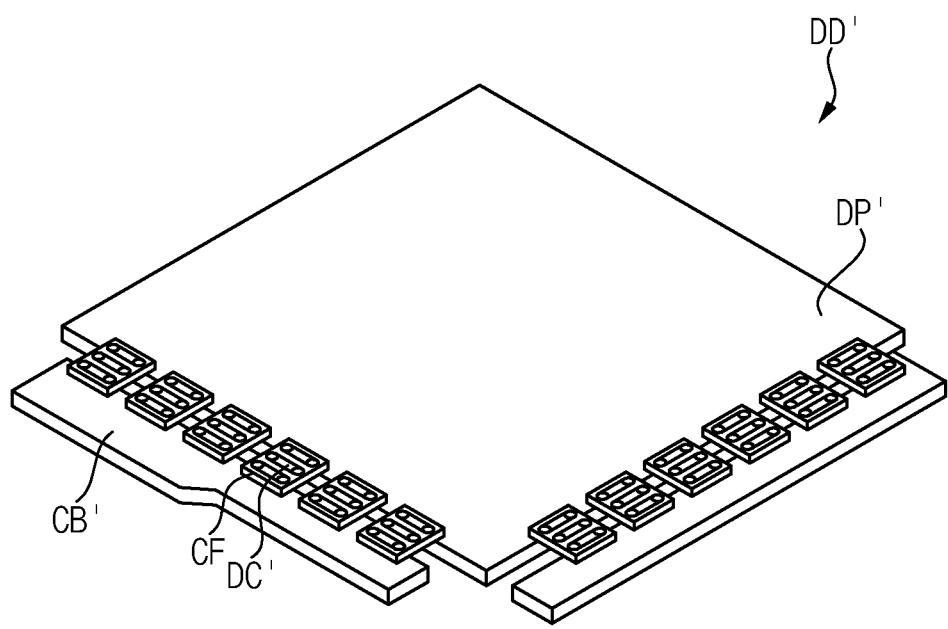
FIG. 10 is a perspective view illustrating a display device according to an embodiment.

FIG. 10 is a perspective view illustrating a display device DD' according to an embodiment.

Referring to FIG. 10, the display device DD' may include a display panel DP', a circuit board CB', a connection film CF, and a driving circuit chip DC'. The display panel DP' of FIG. 9 may be relatively larger than the display panel DP of FIG. 1. The circuit board CB' may be connected to the non-display area of the display panel DP' through the connection film CF. The connection film CF may be bent such that the circuit board CB' is positioned under or behind the display panel DP'. The driving circuit chip DC' may be mounted on the connection film CF. The circuit board CB' may include the pad unit described with reference to FIG. 2, FIG. 3, and FIG. 4.

The foregoing is illustrative of embodiments and is not to be construed as limiting. Although examples of embodiments have been described, many modifications are possible in the embodiments without departing from the teachings of the present disclosure. All such modifications are within the scope defined in the claims.

What is claimed is:

1. A circuit board, comprising:
   a first pad comprising a first body and a first mesh structure directly connected to the first body;
   a second pad comprising a second body and a second mesh structure, the second mesh structure being directly connected to the second body, spaced from the first mesh structure in a first direction, and disposed between the first mesh structure and the second body in the first direction; and
   a soldering element disposed on the first pad and the second pad, partially disposed between the first mesh structure and the second mesh structure, and electrically connecting the first pad to the second pad,
   wherein a width of the first body in the first direction is greater than a width of the first mesh structure in the first direction, and a width of the second body in the first direction is greater than a width of the second mesh structure in the first direction.

2. The circuit board of claim 1, wherein the first mesh structure is a mirror image of the second mesh structure in a plan view of the circuit board.

3. The circuit board of claim 1, further comprising:
   a first wire electrically connected through the first body to the first mesh structure; and
   a second wire electrically connected through the second body to the mesh structure.

4. A circuit board, comprising:
   a first pad comprising a first body and a first mesh structure directly connected to the first body;
   a second pad comprising a second body and a second mesh structure, the second mesh structure being directly connected to the second body, spaced from the first mesh structure in a first direction, and disposed between the first mesh structure and the second body in the first direction; and
   a soldering element disposed on the first pad and the second pad, partially disposed between the first mesh structure and the second mesh structure, and electrically connecting the first pad to the second pad,
   wherein a second direction is perpendicular to the first direction,
   wherein the first mesh structure comprises:
   first conductive lines each extending in a third direction oblique relative to the first direction;
   second conductive lines each extending in a fourth direction oblique relative to the first direction and different from the third direction; and
   first junctions where the first conductive lines and the second conductive lines meet, and
   wherein the second mesh structure comprises:
   third conductive lines each extending oblique relative to the first direction;
   fourth conductive lines each extending oblique relative to the first direction and not parallel to the third conductive lines; and
   second junctions where the third conductive lines and the fourth conductive lines meet.

5. The circuit board of claim 4,
   wherein the first junctions include first edge junctions located at an edge of the first pad,
   wherein the second junctions include second edge junctions located at an edge of the second pad, and
   wherein the first edge junctions face the second edge junctions.

6. The circuit board of claim 5, wherein the soldering element comprises:
   a first portion overlapping the first pad;
   a second portion overlapping the second pad; and a third portion disposed between the first portion and the second portion and directly contacting the first edge junctions and the second edge junctions.

7. The circuit board of claim 6,
wherein the first portion is disposed on both the first body and the first mesh structure, and
wherein the second portion is disposed on both the second body and the second mesh structure.

8. The circuit board of claim 6, wherein the third portion of the soldering element includes an opening that extends in the second direction.

9. The circuit board of claim 6, wherein the first portion of the soldering element includes an opening that extends in the second direction.

10. The circuit board of claim 6, wherein the second portion of the soldering element includes an opening that extends in the second direction.

11. A display device, comprising:
a display panel comprising a display area and a non-display area, wherein the display area comprises pixels, and wherein the non-display area abuts the display area; and
a circuit board attached to the non-display area,
wherein the circuit board comprises:
a first pad comprising a first body and a first mesh structure directly connected to the first body;
a second pad comprising a second body and a second structure, the second mesh structure being directly connected to the second body, spaced from the first mesh structure in a first direction, and disposed between the first mesh structure and the second body in the first direction; and
a soldering element disposed on the first pad and the second pad, partially disposed between the first mesh structure and the second mesh structure, and electrically connecting the first pad to the second pad,
wherein a width of the first body in the first direction is greater than a width of the first mesh structure in the first direction, and a width of the second body in the first direction is greater than a width of the second mesh structure in the first direction.

12. The display device of claim 11, wherein the first mesh structure is a mirror image of the second structure in a plan view of the circuit board.

13. The display device of claim 11,
wherein a second direction is perpendicular to the first direction,
wherein the first mesh structure comprises:
first conductive lines each extending in a third direction oblique relative to the first direction;
second conductive lines each extending in a fourth direction oblique relative to the first direction and different from the third direction; and
first junctions where the first conductive lines and the second conductive lines meet, and
wherein the second mesh structure comprises:
third conductive lines each extending oblique relative to the first direction;
fourth conductive lines each extending oblique relative to the first direction and not parallel to the third conductive lines; and
second junctions where the third conductive lines and the fourth conductive lines meet.

14. The display device of claim 13,
wherein the first junctions include first edge junctions located at an edge of the first pad,
wherein the second junctions include second edge junctions located at an edge of the second pad, and
wherein the first edge junctions respectively correspond to the second edge junctions.

15. The display device of claim 14, wherein the soldering element comprises:
a first portion overlapping the first pad;
a second portion overlapping the second pad; and
a third portion disposed between the first portion and the second portion and directly contacting the first edge junctions and the second edge junctions.

16. The display device of claim 15,
wherein the first portion is disposed on both the first body and the first mesh structure, and
wherein the second portion is disposed on both the second body and the second mesh structure.

17. The display device of claim 15, wherein the third portion of the soldering element includes an opening that extends in the second direction.

18. The display device of claim 15, wherein the first portion of the soldering element includes an opening that extends in the second direction.

19. The display device of claim 15, wherein the second portion of the soldering element includes an opening that extends in the second direction.

20. The display device of claim 11, further comprising:
a first wire electrically connected through the first body to the first mesh structure; and
a second wire electrically connected through the second body to the second mesh structure.

* * * * *